United States Patent

Sekii et al.

[11] Patent Number: 5,084,893
[45] Date of Patent: Jan. 28, 1992

[54] SEMICONDUCTOR LIGHT-EMITTING DEVICE

[75] Inventors: Hiroshi Sekii, Ibaraki; Koichi Imanaka, Kyoto, both of Japan

[73] Assignee: Omron Corp., Kyoto, Japan

[21] Appl. No.: 539,698

[22] Filed: Jun. 18, 1990

[30] Foreign Application Priority Data

Jun. 29, 1989 [JP] Japan .................. 1-165344

[51] Int. Cl.⁵ .............................. H01S 3/19
[52] U.S. Cl. ........................ 372/46; 372/45
[58] Field of Search ............ 372/45, 46, 40; 357/17

[56] References Cited

U.S. PATENT DOCUMENTS 4,845,724  7/1989  Hayakawa et al. ............ 372/46

FOREIGN PATENT DOCUMENTS 63-122187  5/1988  Japan .
63-220588  9/1988  Japan .
0106085  4/1990  Japan .

Primary Examiner—Georgia Epps
Attorney, Agent, or Firm—Dickstein, Shapiro & Morin

[57] ABSTRACT

In a ridge waveguide-type semiconductor light-emitting device, a buried layer is composed of a high-resistance semiconductor material (e.g., amorphous silicon), thereby improving the heat-dissipating characteristic and prolonging lifetime. The buried layer is made higher than the top surface of the ridge, the top surface of the ridge is situated in the resulting recess, and an electrode is formed from the top surface of the ridge to the top surface of the surrounding buried layer to cover the entirety of these surfaces. Making the buried layer higher than the top of the ridge prevents an electrical short circuit for being caused by an electrically conductive bonding agent used in junction-down mounting.

11 Claims, 4 Drawing Sheets

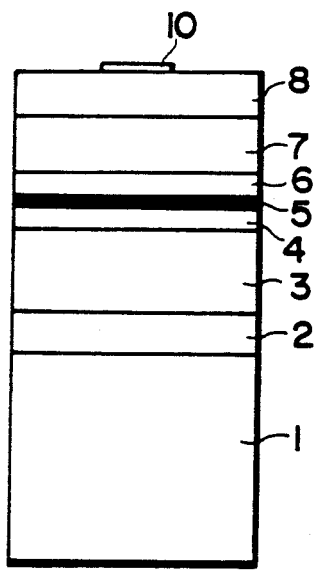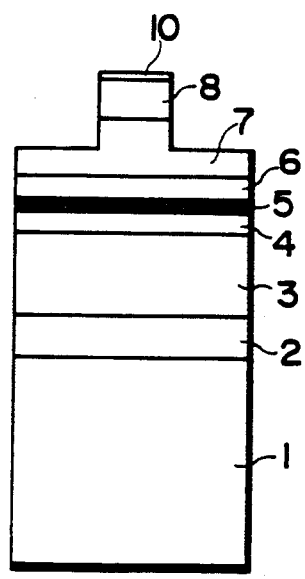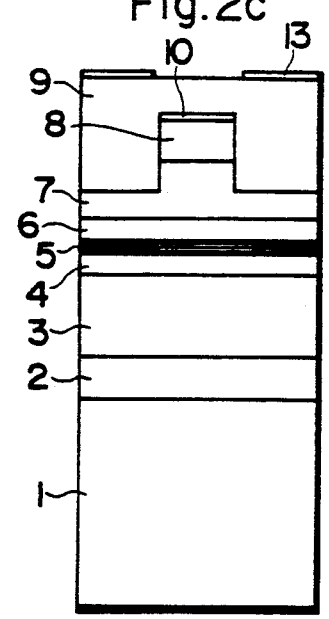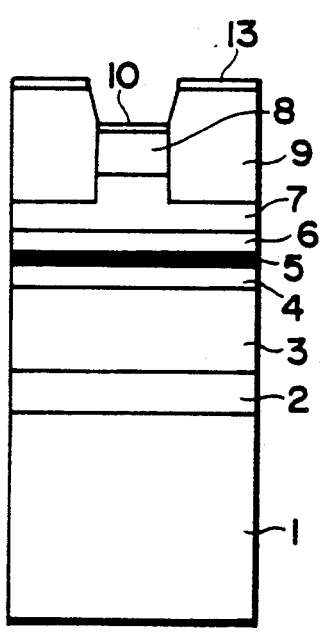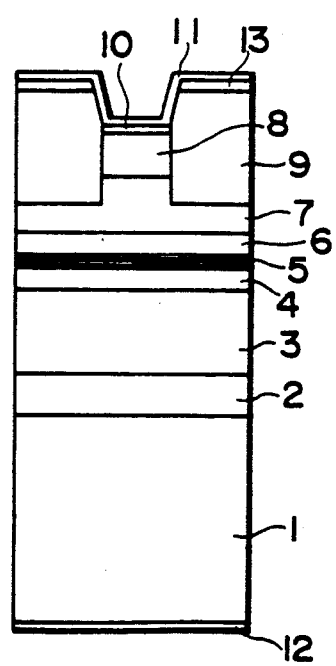

SEMICONDUCTOR LIGHT-EMITTING DEVICE

BACKGROUND OF THE INVENTION

1. Field of the Invention

This invention relates to a semiconductor light-emitting device and a method of manufacturing the same.

2. Description of the Related Art

A CSP (channeled substrate planar) laser, TJS (transverse junction stripe) laser, PBR (polyimide buried ridge) laser and the like are examples of current-restriction-type semiconductor light-emitting devices. The cost and device performance of such lasers are decided by the simplicity and reliability of the manufacturing process.

An example of the structure of a CSP laser is illustrated in FIG. 3. This CSP laser is fabricated by the following manufacturing process:

A stripe-shaped groove 26 having a width of about 5 $\mu$m is formed in an n-GaAs substrate 21, and an n-$Al_{0.33}Ga_{0.67}As$ layer 22 is grown on the substrate so as to smoothen and flatten the entire surface thereof. Next, an $Al_{0.05}Ga_{0.95}As$ active layer 23, a p-$Al_{0.33}Ga_{0.67}As$ layer 24 and an n GaAs layer 25 are successively grown. Thereafter, Zn diffusion is performed at a position corresponding to the stripe-shaped groove 26 (the Zn-diffusion region is indicated at numeral 27) to produce a current-pinched region. Finally, the top and bottom sides of the element are provided with a p-electrode 28 and an n-electrode 29, respectively.

The CSP laser is manufactured by an LP process (liquid-phase epitaxy) or MOCVD process (metal-organic chemical vapor deposition).

This CSP laser and its method of manufacture have the following drawbacks:

1) In order to obtain high-quality crystal growth with the LP process, the entire surface of the substrate is etched lightly (referred to as "light etching") prior to crystal growth. However, since the substrate of the CSP laser is processed to have the groove of the about 5 $\mu$m width before crystal growth takes place, the corners of the groove will be blunted if the substrate surface is subjected to light etching. For this reason, the light etching step is omitted. As a consequence, crystal growth takes place with the substrate surface left unsmoothened, as a result of which crystals of high quality cannot be obtained.

2) As mentioned above, only the LP process or MOCVD process can be used to grow crystals on a substrate having a groove. However, when it is attempted to grow crystals on a substrate surface having a groove by either of these methods, control is difficult to perform since the rate of growth is dependent upon the surface orientation, back etching occurs and the shape of the groove itself changes.

3) Since it is necessary to register a mask accurately with respect to the groove position in the Zn-diffusion step, the process is a complicated one.

4) The Zn-diffusion step itself requires accurate temperature control and a long period of time.

In view of the foregoing, problems are encountered in terms of reducing cost and achieving performance stability.

An example of the structure of a TJS laser is depicted in FIG. 4. The process for manufacturing such a TJS laser is as follows:

An n-$Al_{0.4}Ga_{0.6}As$ layer 32, n+-$Al_yGa_{1-y}As$ active layer 33, an n-$Al_{0.4}Ga_{0.6}As$ layer 34, a p-$Al_{0.4}Ga_{0.6}As$ layer 35 and an n--GaAs layer 36 are successively grown on an n-GaAs substrate 31. Thereafter, p+-Zn diffusion is performed at a predetermined region 37, and finally a p-electrode 39 and n-electrode 40 are provided. Current injected from the p+-Zn diffusion region 37 flows laterally through the active layer 33, as indicated by the arrow, and this forms a type of current-pinched region as well as an oscillation region 38 in which lasing taking place.

Since the structure of the TJS laser is such that crystals are caused to grow on a flat substrate, crystal growth itself takes place with facility but the manufacturing process has the following shortcomings:

5) The Zn diffusion step requires accurate temperature control and a long period of time.

6) Since Zn diffusion also occurs in the lateral direction, the oscillation region lacks positional controllability.

In view of the foregoing, problems are encountered in terms of reducing cost and achieving performance stability.

The applicant has proposed a PBR laser [for example, see Japanese Patent Application Laid-Open (KOKAI) No. 63-122187] the manufacturing process of which will now be described with reference to FIGS. 5a through 5e. First, an n-$Al_xGa_{1-x}As$ cladding layer 42, a GaAs active layer 43, a p-$Al_xGa_{1-x}As$ cladding layer 44 and a p+-GaAs cap layer 45 are grown on an n-GaAs substrate 41 by a single process, and a stripe-shaped etching mask 47 having a width of about 5 $\mu$m is formed on the cap layer 45 as by a photoresist (FIG. 5a). Next, in FIG. 5b, portions of the cladding layer 44 and cap layer 45 not covered with the mask 47 are etched down to an intermediate level of the cladding layer 44 (by chemical etching or dry etching), thereby forming a ridge portion. Further, in FIG. 5c, the etching mask 47 is removed, after which the entire surface of the semiconductor wafer is coated with enough heat-resistant polyimide resin 48 to flatten the top surface. The resin is allowed to harden. Thereafter, in FIG. 5d, the resin 48 is removed by ashing using oxygen plasma until the crown of the ridge portion is reached. Finally, a p-side electrode 49 and an n-side electrode 50 are vapor-deposited on the top and bottom portions of the element, respectively, as shown in FIG. 5e.

The cap layer 45 and the top surface of the resin 48 are flush and flat, and the electrode 49 is formed over the entirety of these upper surfaces. The low, flat portions on both sides of the ridge are buried by the resin 48.

When a current is passed through the thus-obtained PBR semiconductor laser from the electrode 49 to the electrode 50, no current flows into the low flat portions on both sides of the ridge owing to the resin 48, and current concentrates only in the ridge portion. As a result, only the portion of the active layer 43 underlying the ridge serves as a light-emitting portion and performs transverse-mode controlled lasing.

Since this PBR laser is such that the growth and etching process both need be performed only one time, it is possible to lower cost.

In addition, owing to crystal growth on a flat substrate and the use of an etching process having excellent controllability, the device performance exhibits a high stability. These are the characterizing features of this laser.

Furthermore, since the top surface formed to have the ridge is flat, so-called junction-down mounting (a mounting method exhibiting an excellent heat-dissipating characteristic in which the element is turned upside down so that the substrate 41 is on top,) becomes possible and a higher output can be expected.

However, though the polyimide resin used for burying the ridge portion possesses excellent characteristics in terms of electrical insulation and thermal expansion, its thermal conductivity is poor and therefore the heat produced in the oscillation region cannot be given off efficiently to the outside. Even if the abovementioned junction-down method is employed, there is little increase in the efficiency of thermal dissipation and the service lifetime of the device is hardly improved. In addition, since the height of the ridge is on the order of 2 μm, there is the danger of a short circuit when an electrically conductive adhesive containing In, Sn or the like is used in junction-down mounting.

SUMMARY OF THE INVENTION

An object of the present invention is to improve the heat-dissipating characteristic to improve device lifetime while maintaining the possibility of lowering the cost of a PBR laser as well as the stability (high yield) of the characteristics.

According to the present invention, the foregoing object is attained by providing a ridge-type semiconductor light-emitting device characterized in that low, flat portions on both sides of a ridge are provided with a buried layer, having a height greater than that of a top surface of the ridge and consisting of a high-resistance semiconductor material, a recess is formed in the buried layer at the position of the top surface of the ridge, and an electrode is formed that extends continuously from the top surface of the ridge to a top surface of the buried layer.

A method of manufacturing a semiconductor light-emitting device according to the present invention is characterized by forming a ridge on a semiconductor wafer, forming a polycrystal or amorphous buried layer consisting of a high-resistance semiconductor material around and on the ridge portion so as to bury the same, thereafter etching away a location of the buried layer overlying the ridge until a top surface of the ridge is exposed, and forming an electrode on the entirety of the exposed top surface of the ridge and the top surface of the buried layer surrounding the ridge.

The high-resistance semiconductor material used in the buried layer has an electrical conductivity lower than that of the semiconductor wafer but a thermal conductivity and coefficient of thermal expansion approximately the same as those of the semiconductor wafer material (the difference between them preferably is within two figures). Examples of the material are amorphous silicon (α-Si), zinc sulfide (ZnS) and gallium antimony (GaSb). In particular, in the case of a semiconductor wafer of the GaAs type, it is preferable to use α-Si, whose physical characteristics such as the lattice constant closely resemble those of such a semiconductor wafer. The α-Si material is ideal for use at a high thermal conductivity.

A vapor deposition method, sputtering or the like can be used to form the polycrystal or amorphous buried layer.

In accordance with the present invention, it is possible to obtain a light-emitting device which is low in cost and possessed of excellent stability just as the above-mentioned PBR laser. The heat-dissipating characteristic is improved since a high-resistance semiconductor material such as α-Si is used as the material for the buried layer. Owing to the improvement in the heat-dissipating characteristic, junction-down mounting can be effectively exploited and the service life of the element can be prolonged.

Even if an electrically conductive adhesive containing In is used in junction-down mounting, Si exhibits little affinity with respect to In and In will not adhere to it. This makes it possible to diminish the danger of electrical short circuits caused by the adhesive. In particular, according to the invention, the buried layer surrounding the ridge is formed to be higher than the ridge. As a result, the distance between the top surface of the device (the bottom surface bonded to a printed circuit board in junction-down mounting) and the vicinity of the active layer of the element can be enlarged to diminish even further the danger of a short circuit caused by the adhesive.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2a through 2e are diagrams illustrating steps for manufacturing the semiconductor laser of FIG. 1; and FIGS. 3 through 5 illustrate examples of the prior art, in which:

FIG. 3 is a sectional view showing the construction of a CSP laser;

FIG. 4 is a sectional view showing the construction of a TJS laser; and

DESCRIPTION OF THE PREFERRED EMBODIMENT

Figure 1:
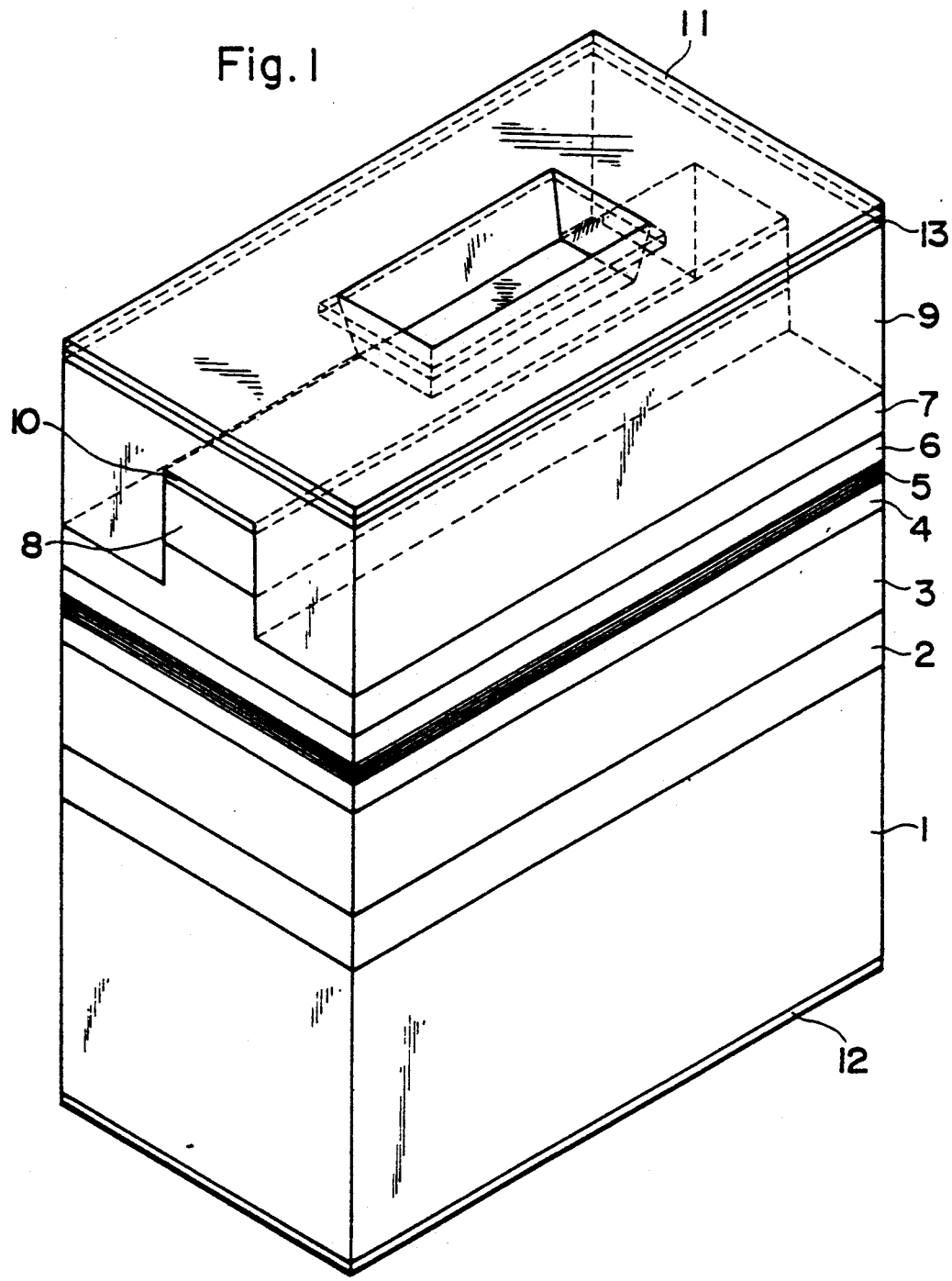
FIG. 1 is a perspective view of a ridge-type semiconductor laser embodying the present invention.
Figure 3:
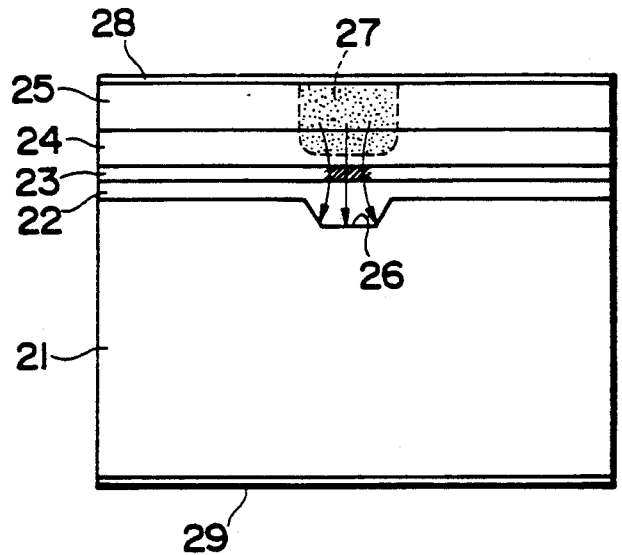
Figure 4:
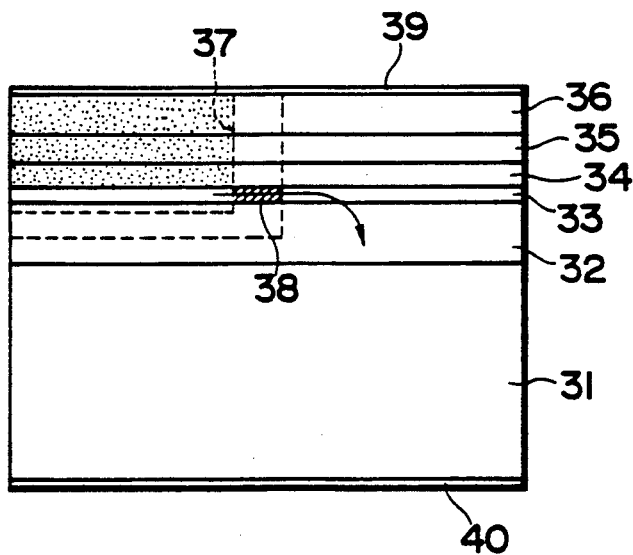
Figure 5A:
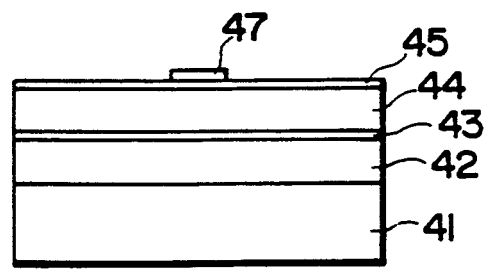
FIGS. 5a through 5e show steps for manufacturing a PBR laser.
Figure 5B:
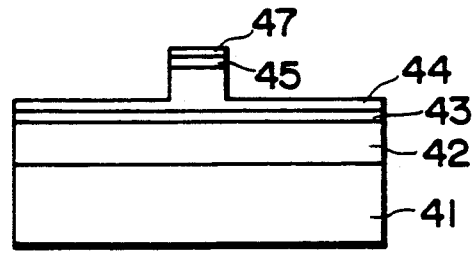
Figure 5C:
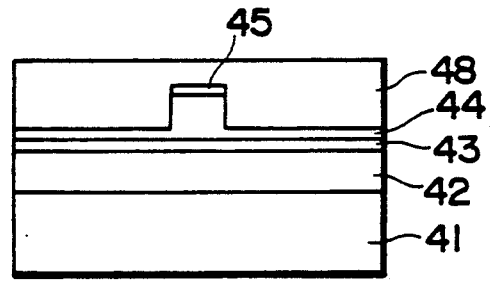
Figure 5D:
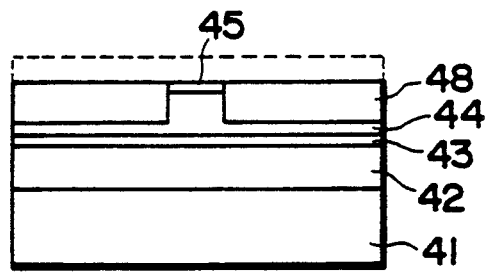
Figure 5E:
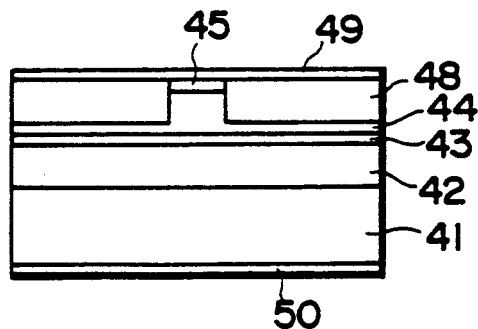

FIG. 1 is a perspective view illustrating a ridge waveguide-type semiconductor laser in an embodiment of the present invention, and FIGS. 2a through 2e illustrate the manufacture of this semiconductor laser. Since the structure of the semiconductor laser shown in FIG. 1 will become apparent from the description of the manufacturing steps, the process for manufacturing this semiconductor laser will be explained with reference to FIGS. 2a through 2e.

As shown in FIG. 2a, an n-GaAs layer 2, an n-AlGaAs layer 3, a GRIN (graded-index)-AlGaAs layer 4, a quantum-well active layer 5 based on a superlattice, a GRIN-AlGaAs layer 6, a p-AlGaAs layer 7 and a p+-GaAs layer 8 are grown by a one-time crystal growth process on an n-GaAs substrate 1, and a stripe-shaped etching mask 10 having a width of less than 3 μm is formed on the semiconductor wafer by photolithograpy. The mask 10 preferably can be used also as an ohmic electrode of GrAu, by way of example.

Next, as shown in FIG. 2b, the portions of the p+-GaAs layer 8 and p-AlGaAs layer 7 not covered by the mask 10 are removed down to an intermediate portion of the p-AlGaAs layer 7 by an RIE (reactive ion etching) process using $BCl_3$ gas, by way of example, thereby forming a ridge portion. The etching process is not limited to chemical etching, for example, dry etching can also be employed. In addition, it will suffice if the width and height of the ridge portion are decided by the guided mode sought.

Further, as shown in FIG. 2c, a buried layer 9 of, say, α-Si, is formed by vacuum deposition on the entire surface of the semiconductor wafer until the top surface thereof becomes substantially flat, thereby burying the ridge from its periphery and upper side. A mask 13 consisting of an TiAu electrode material is fabricated by photolithography on the top surface of the α-Si buried layer 9 leaving exposed the portion overlying the ridge. The shape and size of the window of mask 13 are optional, and it will suffice if the window is situated above the ridge.

Next, as depicted in FIG. 2d, the RIE process using $CF_4$ gas is used to remove the uncovered portion of the α-Si buried layer 9 at the window of the mask 13 until the mask electrode 10 is exposed. In this way a contact hole reaching the top surface of the ridge is formed in the top surface of the buried layer 9.

Finally, as illustrated in FIG. 2e, a p-side electrode (CrAu) 11 is formed extending continuously from the top surface of the buried layer 9 to the top surface of the ridge, and an n-side electrode (AuGeNi) 12 is deposited on the bottom side of the wafer. This ends the manufacturing process.

The configuration is such that low, flat portions on both sides of the ridge are buried by the α-Si layer to a level higher than the top surface of the ridge.

Forming the wafer into individual elements and the assembly thereof, which are carried out in a final stage, may be performed using ordinary methods.

When a current is passed through the thus-obtained semiconductor laser device from the electrode 11 to the electrode 12, no current flows into the low, flat portions on both sides of the ridge owing to the buried layer 9, and current concentrates only in the ridge portion. As a result, only the portion of the active layer 5 underlying the ridge serves as a light-emitting portion and performs transverse-mode controlled lasing.

The α-Si layer not only has a high electrical resistance and therefore an excellent insulating property, but the coefficient of thermal expansion and the thermal conductivity thereof are substantially the same as those of the GaAs constituting the device material. This makes it possible to improve the heat-dissipating characteristic without subjecting the laser element to stress. Prolonged service life can be expected as a result.

In addition, the buried layer 9 can be made sufficiently higher than the ridge so that the distance from the p-electrode 11 on the top side to the active layer 5 can be enlarged. Even if the electrically conductive adhesive which bonds the p-electrode 11 to a printed circuit board bulges somewhat to the outside in junction-down mounting, an electrical short circuit between the p-electrode 11 and the active layer 5 due to the adhesive can be prevented before it occurs.

It goes without saying that all of the p and n conductivity types can be reversed in the foregoing embodiment. In addition, though the quantum well structure is disclosed in the embodiment, the active layer may be of an ordinary double hetero-junction structure. Furthermore, the active layer can be of a distribution feedback type. It goes without saying that the semiconductor wafer is not limited to one of the GaAs type. The present invention is applicable not only to a semiconductor laser but also to a light-emitting diode.

As many apparently widely different embodiments of the present invention can be made without departing from the spirit and scope thereof, it is to be understood that the invention is not limited to the specific embodiments thereof except as defined in the appended claims.

What is claimed is:

1. In a ridge-type semiconductor light-emitting device comprising:
   a buried layer structure
   a ridge having a top surface and flat portions of a lower height on both sides thereof;
   a buried layer having a height greater than that of the top surface of said ridge and consisting of a high-resistance semiconductor material, said buried layer having a top surface and being formed to have a recess at a position corresponding to the top surface of said ridge; and
   an electrode formed to extend continuously from the top surface of said ridge to the top surface of said buried layer.

2. The device of claim 1, wherein said light-emitting device comprises a semiconductor laser.

3. The device of claim 1, wherein said light-emitting device comprises a light-emitting diode.

4. The device of claim 1, further comprising an active layer formed below said ridge whereby, owing to said buried layer, current concentrates only in said ridge portion such that only a portion of said active layer underlying said ridge serves as a light-emitting portion.

5. The device of claim 1, wherein said buried layer has a substantially similar coefficient of thermal expansion and thermal conductivity as said semiconductor device such that improved heat dissipation occurs which in turn reduces stress in said light-emitting device.

6. The device of claim 1, wherein said buried layer is substantially higher than said ridge so that when an electrically conductive adhesive is used with said device, the height of said layer substantially reduces a potential for a short circuit.

7. The device of claim 1, further comprising a substrate layer formed below said ridge.

8. The device of claim 7, further comprising an active layer formed between said substrate and said ridge.

9. The device of claim 8, further comprising a second electrode formed below said substrate layer.

10. The device of claim 9, further comprising a resonant cavity for said semiconductor device.

11. A ridge-type semiconductor light-emitting device, comprising:
    a substrate layer;
    an active layer formed on said substrate layer;
    a ridge having a top surface and flat portions of a lower height on both sides thereof;
    a buried layer having a height greater than that of the top surface of said ridge and consisting of a high-resistance semiconductor material, said buried layer having a top surface and being formed to have a recess at a position corresponding to the top surface of said ridge;
    a first electrode formed to extend continuously form the top surface of said ridge to the top surface of said buried layer;
    a second electrode formed on a bottom surface of said substrate layer; and
    a resonant cavity.

* * * * *